US008633600B2

(12) United States Patent
Mengel et al.

(10) Patent No.: US 8,633,600 B2
(45) Date of Patent: Jan. 21, 2014

(54) DEVICE AND METHOD FOR MANUFACTURING A DEVICE

(75) Inventors: Manfred Mengel, Bad Abbach (DE); Joachim Mahler, Regensburg (DE); Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 157 days.

(21) Appl. No.: 12/886,851

(22) Filed: Sep. 21, 2010

(65) Prior Publication Data

US 2012/0068364 A1   Mar. 22, 2012

(51) Int. Cl.
*H01L 23/48* (2006.01)
*H01L 23/52* (2006.01)
*H01L 29/40* (2006.01)

(52) U.S. Cl.
USPC ............... 257/783; 257/782; 257/E21.514; 257/E23.023

(58) Field of Classification Search
USPC ............... 257/782, 783, E21.514, E23.02, 257/E23.023
See application file for complete search history.

(56) References Cited

U.S. PATENT DOCUMENTS

| | | | |
|---|---|---|---|
| 4,606,962 A | | 8/1986 | Reylek et al. |
| 6,150,195 A | * | 11/2000 | Chiu et al. ................... 438/118 |
| 6,373,141 B1 | * | 4/2002 | DiStefano et al. ............ 257/783 |
| 7,199,476 B2 | | 4/2007 | Hill |
| 2002/0012762 A1 | * | 1/2002 | Bunyan ........................ 428/40.2 |
| 2002/0190388 A1 | | 12/2002 | Eytcheson |
| 2006/0061974 A1 | * | 3/2006 | Soga et al. .................... 361/743 |
| 2008/0084681 A1 | * | 4/2008 | Naito et al. ................... 361/818 |
| 2009/0065590 A1 | * | 3/2009 | Aoki et al. .................... 235/492 |
| 2009/0291516 A1 | * | 11/2009 | Takayama et al. .............. 438/26 |
| 2009/0302456 A1 | * | 12/2009 | Oikawa et al. ................ 257/701 |
| 2010/0007942 A1 | * | 1/2010 | Oikawa et al. ................ 359/296 |
| 2010/0013372 A1 | * | 1/2010 | Oikawa et al. ................ 313/498 |

FOREIGN PATENT DOCUMENTS

DE  10 2004 048 529 A1  5/2005
EP       1 130 643 A2    9/2001

OTHER PUBLICATIONS

Walker, "Chambers Dictionary of Science and Technology," Chambers Harrap Publishers Ltd., Edinburgh, Scotland, 1999, 5 pages.
Gratz, et al., "Solder Joints vs. Conductive Adhesive Bonds: A Direct Comparison for SMT Packaging Technologies," Dresden University of Technology, Semiconductor Technologies and Microsystems Laboratory, Dresden, Germany, www.epotek.com/SSCDocs/whitepapers/Tech%20Paper%2045.pdf,retrieved on Dec. 17, 2012, 10 pages.

* cited by examiner

*Primary Examiner* — Jarrett Stark
(74) *Attorney, Agent, or Firm* — Slater & Matsil, L.L.P.

(57) ABSTRACT

A device includes a semiconductor material having a first surface. A first material is applied to the first surface and a fiber material is embedded in the first material.

8 Claims, 6 Drawing Sheets

S1: APPLYING A FIRST MATERIAL TO A FIRST SURFACE OF A SEMICONDUCTOR MATERIAL

S2: APPLYING A FIBER MATERIAL TO THE FIRST SURFACE

S1: APPLYING A FIRST MATERIAL TO A FIRST SURFACE OF A SEMICONDUCTOR WAFER

S2: APPLYING A FIBER MATERIAL TO THE FIRST SURFACE

S3: DICING THE SEMICONDUCTOR WAFER INTO MULTIPLE SEMICONDUCTOR CHIPS

S4: ARRANGING AT LEAST ONE OF THE SEMICONDUCTOR CHIPS OVER A CARRIER

DEVICE AND METHOD FOR MANUFACTURING A DEVICE

TECHNICAL FIELD

The invention relates to a device and a method for manufacturing a device.

BACKGROUND

Electrical devices may include electrical components such as integrated circuits and semiconductor chips. Some of these electrical components are attached to carriers, for example, substrates or leadframes.

During fabrication, electrical components pass through multiple manufacturing steps. After fabrication, the electrical components may be packed for transportation and delivered to customers. The customers may further process the electrical components or operate them without further modifications.

Performance and reliability of electrical components must constantly be improved. Further, improved methods for manufacturing electrical components should provide high performance, high reliability, and low manufacturing costs. For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION OF ILLUSTRATIVE EMBODIMENTS

Aspects and embodiments are described with reference to the drawings, wherein like reference numerals are generally utilized to refer to like elements throughout. In the following description, for purposes of explanation, numerous specific details are set forth in order to provide a thorough understanding of one or more aspects of the embodiments. However, it may be evident to a person skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense and the scope is defined by the appended claims. It is also noted that the representations of the various elements in the figures are not necessarily to scale.

In the following description, reference is made to the accompanying drawings which form a part thereof and in which is shown by way of illustration specific embodiments in which the invention may be practiced. In this regard, directional terminology, such as, e.g., "upper", "lower", "top", "bottom", "left-hand", "right-hand", "front side", "backside", "vertical", "horizontal", etc., may be used with reference to the orientation of the figures being described. Because components of embodiments can be positioned in a number of different orientations, the directional terminology is used for purposes of illustration and is in no way limiting. It is understood that further embodiments may be utilized and structural or logical changes may be made without departing from the scope of the present invention. The features of the various exemplary embodiments described herein may be combined with each other, unless specifically noted otherwise.

As employed in this specification, the terms "coupled", "electrically coupled", "connected" or "electrically connected" are not meant to mean that the elements must be directly coupled or connected together. Intervening elements may be provided between the "coupled", "electrically coupled", "connected" or "electrically connected" elements.

The devices described below may include a semiconductor material like Si, SiC, SiGe, GaAs or an organic semiconductor material. For example, the semiconductor material may be a semiconductor wafer having a diameter lying in a range of about 50 to about 300 millimeters. The thickness of the semiconductor wafer may range from 60 to 300 micrometers. In case of a thin semiconductor wafer, the thickness may be reduced down to 20 micrometers. The semiconductor material may also be a semiconductor chip of arbitrary type. For example, the semiconductor chip may be configured as a power semiconductor chip, such as a power MOSFET (Metal Oxide Semiconductor Field Effect Transistor), an IGBT (Insulated Gate Bipolar Transistor), a JFET (Junction Gate Field Effect Transistor) or a power bipolar transistor. Further, the semiconductor chip may include control circuits, i.e., logic integrated circuits to control the integrated circuits of the semiconductor chip, microprocessors or microelectromechanical components. Besides, the semiconductor chip may further include inorganic and/or organic materials that are not semiconductors, for example, insulators, plastics or metals.

The semiconductor chip may be a bare die or a semiconductor package. After dicing a semiconductor wafer, the obtained components may be referred to as "die", "dice" or "dies". Unpackaged dies which are directly placed on, for example, a printed circuit board (PCB) or a substrate are referred to as "bare dies" or "bare chips". A bare die thus corresponds to an integrated circuit that has been cut from a semiconductor wafer and is not packaged or encapsulated by a housing, for example, made of a plastic or a ceramic material. A bare die may have the thickness of the semiconductor wafer it is produced of, in particular, about 60 micrometers or less and even more particular from 20 to 30 micrometers. The dies may also be packaged or encapsulated in an encapsulation material or molding material. The encapsulation material may be electrically insulating and may be any appropriate duroplastic, thermoplastic or thermosetting material or laminate. Various techniques may be employed to cover the dies with electrically insulating material, for example, compression molding, injection molding, powder molding, liquid molding or lamination.

The devices described below may include a fiber material. The fibers contained in the fiber material may be arranged in the form of a woven fabric having an arbitrary weaving pattern. In particular, the fibers may be arranged in the form of a three-dimensional mesh (or grid or lattice) having a mesh width (i.e., a distance between adjacent fibers) of 1 micrometer to 1 millimeter, in particular, 10 to 200 micrometers and even more particular 5 to 8 micrometers. It is understood that the term "mesh" does not necessarily refer to a geometrically perfect three-dimensional lattice. Of course, the fibers may overlap or may be entangled and interwoven with each other. The term "mesh width" may thus indicate the smallest distance or, alternatively, an average distance between adjacent fibers. Due to its material characteristics which will be explained later, the fiber material may be electrically and thermally conductive in directions along the long axis of the fibers contained therein. Since the fiber material or the mesh may include fibers running in various directions, the fiber material may be electrically and thermally conductive in multiple directions. Preferably, most of the fibers run in a specific direction and a direction perpendicular thereto. However, there also may be a considerable amount of fibers running in a further direction.

The fiber material may include carbon fibers which may also be referred to as graphite fibers or carbon graphite. Carbon fibers mostly include carbon atoms bonded together in microscopic crystals that are more or less aligned parallel to the long axis of the fibers. In graphite, the carbon atoms are arranged in sheets of hexagonal aromatic rings. Carbon fibers are a form of graphite in which these sheets are long and thin. The carbon fibers may have a diameter (in a direction perpendicular to the long axis of the fiber) of 1 micrometer to 1 millimeter, in particular, 10 to 200 micrometers and even more particular 5 to 8 micrometers.

The carbon fibers may have a specific heat capacity of about 710 J/(kg×K), a heat conductivity of about 17 W/(m×K), a coefficient of thermal expansion (CTE) of about $-0.1 \times 10^{-6} \times (1/K)$ and a specific electric resistance of about $1.6 \times 10^{-3}$ Ohm×cm. The carbon fibers may particularly be High Tenacity (HT) carbon fibers having a density of about 1.8 g/cm$^3$, a diameter of about 6 micrometers, a tensile strength of about 3530 MPa(N/mm$^2$), a Young modulus of about 230 GPa and a breaking elongation of about 1.5%.

The fiber material may include metal fibers. The metal fibers may have geometric and material characteristics already described in connection with the carbon fibers. For example, the metal fibers may be made of aluminum, nickel, palladium, titanium, tin, gold or arbitrary metal alloys. Preferably, the metal fibers are made of silver, copper or stainless steel having a CTE$_{steel}$ of about 12 ppm/K. Besides all previously mentioned material, the fiber material may further include glass fibers or fibers made of a ceramic material.

The fiber material may include fibers having a core material coated with a coating material. The core material may have the form of a conventional fiber (see above), but may have a smaller diameter. Preferably, the coating material has material characteristics already described in connection with carbon fibers. The coating material may include polymers, metals, metal alloys or carbon. Referring to all previously mentioned materials, the core material and the coating material may be arbitrarily combined, for example, as polymer-coated metal, metal-coated polymer, carbon-coated metal, metal-coated carbon, etc.

The devices described below may include electrically conductive particles. In particular, the particles may be manufactured from a metal, for example copper, silver, etc. Alternatively, the conductive particles may be made of other materials having similar values of their electrical and/or thermal conductivity. The conductive particles may be of arbitrary shape, for example, ball-shaped, and are preferably located in the fiber material, thereby improving the electrical and thermal conductivity of the fiber material. Here, the conductive particles may be distributed over the whole fiber material, but may also be localized in selected regions of the fiber material.

The (ball-shaped) conductive particles may have a diameter of less than 1 millimeter, in particular less than 20 micrometers and even more particular less than 5 micrometers. Preferably, the size of the conductive particles is adapted to the mesh width of the fiber material. For example, if the mesh width has a value of 20 micrometers, the size of the particles should be less than 20 micrometers such that spaces between fibers of the fiber material are large enough to house or enclose the conductive particles. An application of larger particles would consequently result in a deformation of the fiber material structure at the particles' location or obstruct the spaces of the fiber material.

The devices described below may include an adhesive material, preferably in the form of an adhesive layer. The adhesive material may have the consistency of a paste or a liquid or may alternatively be an adhesive foil. For example, the adhesive material is a duroplastic, thermoplastic, thermosetting resin, polymer, thermosetting polymer, thermosetting adhesive, laminate or epoxy resin. Preferably, the adhesive material has the properties of an A-Stage material, a B-Stage material and a C-Stage material during a curing process. That is, at an early stage of a curing process the adhesive material is still soluble and fusible (A-Stage). At a subsequent stage of the curing process (after precuring), the material softens when heated and swells in the presence of certain liquids, but may not completely fuse or dissolve (B-Stage). The partially cured or precured material may also referred to as "prepreg". After a further subsequent step of the curing process, the adhesive material has reached a final stage in which the material has become infusible and insoluble in common solvents (C-Stage).

Figure 1:
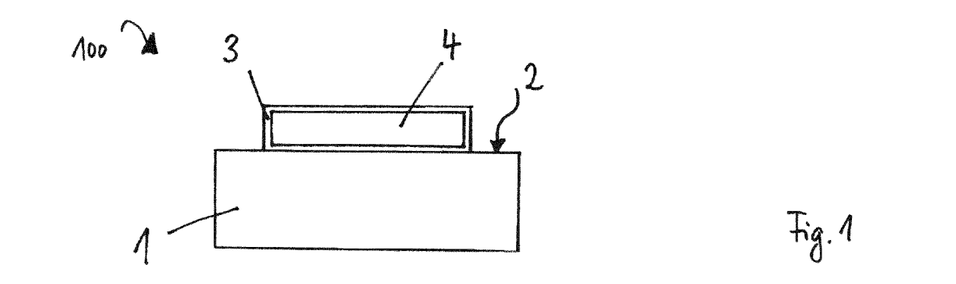
FIG. 1 schematically illustrates a cross-section of a device as an exemplary embodiment.

FIG. 1 schematically illustrates a cross-section of a device 100 as an exemplary embodiment. The device includes a semiconductor material 1 having a first surface 2 and a first material 3 applied to the first surface 2. The first material 3 may be a solder material or an adhesive material. The semiconductor material 1 may be a semiconductor wafer or a semiconductor chip, for example, a power semiconductor. For this case, the first material 3 is preferably electrically coupled to a contact of the power semiconductor. The first material 3 may cover selected parts of the first surface 2, but may alternatively cover the whole first surface 2. For example, the first material 3 covers more than half of the first surface 2 and does not extend over the first surface 2. The device 100 further includes a fiber material 4 embedded in the first material 3. In FIG. 1, the fiber material 4 is substantially distributed throughout the whole first material 3. However, it is also possible that the fiber material 4 may be located at selected regions in the first material 3.

Applying the fiber material 4 may result in various effects on the device 100. During operation of the semiconductor material 1 or electrical components manufactured thereof, heat flows may occur and the temperature within the device 100 may be increased. Due to its good thermal conductivity, the fiber material 4 may support a heat transport away from the semiconductor material 1, for example, to a leadframe (not shown) connected to the device 100. In addition, the semiconductor material 1 or electrical components manufactured thereof may be electrically connected to further electrical components (not shown). Due to good electrical conductivity of the fiber material 4, a conduction of occurring electrical currents may be improved. The first material 3 and the fiber material 4 may further improve the mechanical stability and reliability of the device 100.

Figure 2:
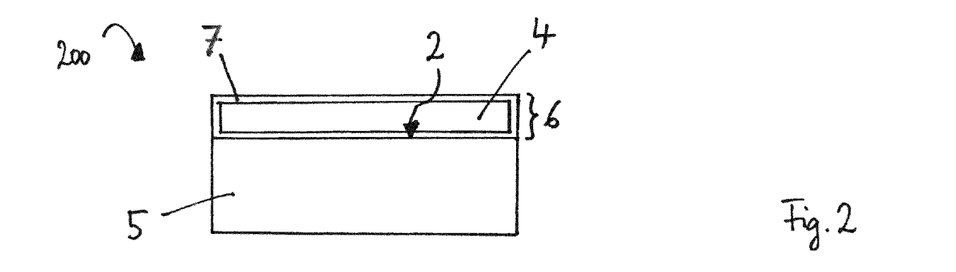
FIG. 2 schematically illustrates a cross-section of a device as a further exemplary embodiment.

FIG. 2 schematically illustrates a cross-section of a device 200 as a further exemplary embodiment. The device 200 includes a semiconductor chip 5 having a first surface 2 and a first layer 6 completely covering the first surface 2. The semiconductor chip 5 may be a bare die. The first layer 6 includes a solder material 7, for example, including a lead solder or a tin solder, and a fiber material 4 embedded in the solder material 7. The fiber material 4 may have any of the characteristics described in foregoing paragraphs. In combination with the solder material 7, the fiber material 4 preferably includes metallic fibers, but may also include any other of the previously described fiber types.

Again, applying the fiber material 4 may result in various effects on the device 200. After dicing a semiconductor wafer, the obtained dies may be picked and placed on a tape before being delivered to a customer. A customer may then pick up the dies from the tape and fix them on a PCB or a substrate, for example, via a soldering process. During these processes, the dies (for example, the semiconductor chip 5) may be damaged or even break because of mechanical stress or strain. Damage may particularly occur for the case of the dies being bare dies of a small thickness. The first layer 6 including the fiber material 4 and the solder material 7 mechanically stabilizes the semiconductor chip 5 which is thus better protected against mechanical damage or a breaking of the semiconductor chip 5. The semiconductor chip 5 may resist higher mechanical stress, strain and tension compared to a semiconductor chip without a similar layer applied thereon.

Further, the first layer 6 including the fiber material 4 and the solder material 7 may have a smaller CTE compared to a layer exclusively including a solder material. The smaller CTE results in a reduced thermomechanical stress occurring between the semiconductor chip 5 and a PCB board (for example, made of an FR4 material) onto which the semiconductor chip 5 is mounted. In addition, using the fiber material 4 may result in an improved solder wetting on metallizations of the semiconductor chip 5.

Figure 3:
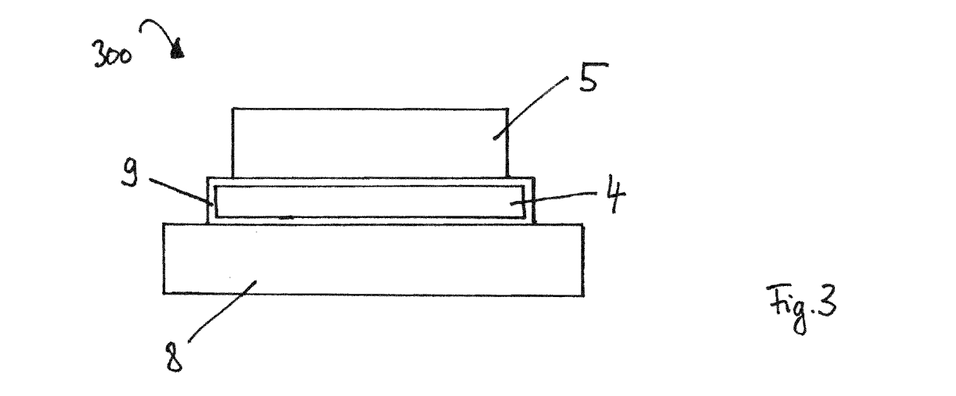
FIG. 3 schematically illustrates a cross-section of a device as a further exemplary embodiment.

FIG. 3 schematically illustrates a cross-section of a device 300 as a further exemplary embodiment. The device 300 includes a carrier 8 and a semiconductor chip 5 arranged over the carrier 8. For example, the carrier 8 is a leadframe, a PCB or a substrate. The device 300 further includes an adhesive layer 9 arranged between the carrier 8 and the semiconductor chip 5. The adhesive layer 9 includes a fiber material 4 embedded therein.

The semiconductor chip 5 may be a power semiconductor including a contact element (not shown), for example, a drain terminal arranged on the bottom side of the semiconductor chip 5 facing the adhesive layer 9. The adhesive layer 9 and the fiber material 4 may then provide an electrical connection between the contact element and the carrier 8 or a further component (not shown) connected to the adhesive layer 9. The value of the electrical conductivity of the adhesive layer 9 including the fiber material 4 may be increased compared to a similar adhesive layer not including a similar fiber material. The electrical conductivity may be further increased by additional conductive particles embedded in the fiber material 4 and/or the adhesive layer 9. For the same reasons, an increased thermal conductivity is provided supporting a heat transport in a direction from the semiconductor chip 5 over the adhesive layer 9 and the fiber material 4 to the carrier 8. It is understood that an increased thermal conductivity may be desirable for any type of semiconductor chip producing heat during its operation.

Applying the fiber material 4 may result in further advantageous effects. For example, the fiber material 4 may improve the mechanical stability and reliability of the adhesive layer 9. In addition, the CTE of the fiber material 4 may be chosen to coincide or at least approach the CTE of the carrier 8 and/or the semiconductor chip 5 such that thermomechanical stress between these components may be reduced. Compared to a solder layer, the adhesive layer 9 including the fiber material 4 has a lower joining temperature and a higher elasticity. Compared to a conventional adhesive foil, the adhesive layer 9 including the fiber material 4 has a higher filling degree of conductive material (including conductive particles and conductive fiber material), a higher breaking resistance and a lower CTE.

Figure 4:
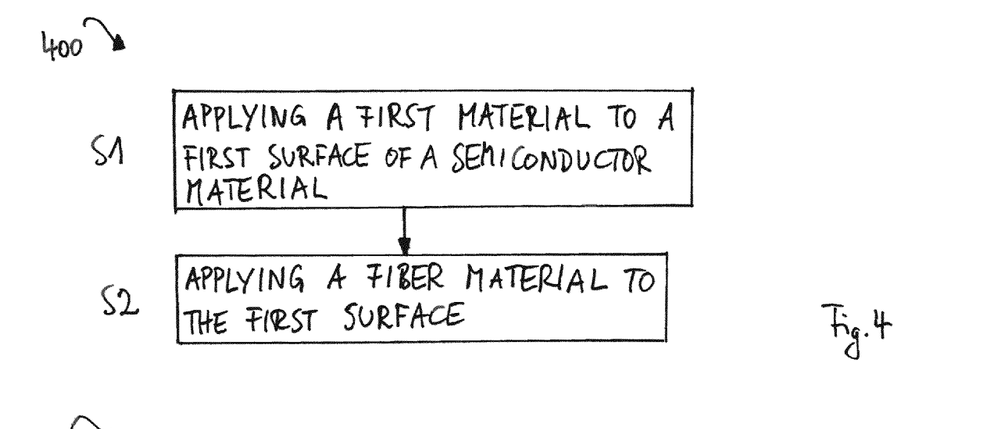
FIG. 4 schematically illustrates a method for manufacturing a device as an exemplary embodiment.

FIG. 4 schematically illustrates a method 400 for manufacturing a device as an exemplary embodiment. For example, the method 400 may be applied to manufacture the devices 100 and 200. FIG. 4 may thus be read in connection with FIGS. 1 and 2. In a first method step S1, a first material is applied to a first surface of a semiconductor material. Referring back to FIGS. 1 and 2, the semiconductor material of method 400 corresponds to the semiconductor material 1 and the semiconductor chip 5, respectively. Further, the first material of method 400 corresponds to the first material 4 and the solder material 7 of FIGS. 1 and 2, respectively.

In a second step S2, a fiber material is applied to the first surface (see fiber material 4 in FIGS. 1 and 2). The first material and the fiber material are applied to the first surface in such a way that the fiber material is embedded in the first material. Note that the method steps S1 and S2 are chronologically interchangeable. That is, the fiber material may penetrate into the first material after the first material has already been applied to the first surface. Alternatively, the first material may fill up the fiber material which is applied to the first surface beforehand. It is also possible that the fiber material and the adhesive are applied to the first surface at the same time.

Figure 5:
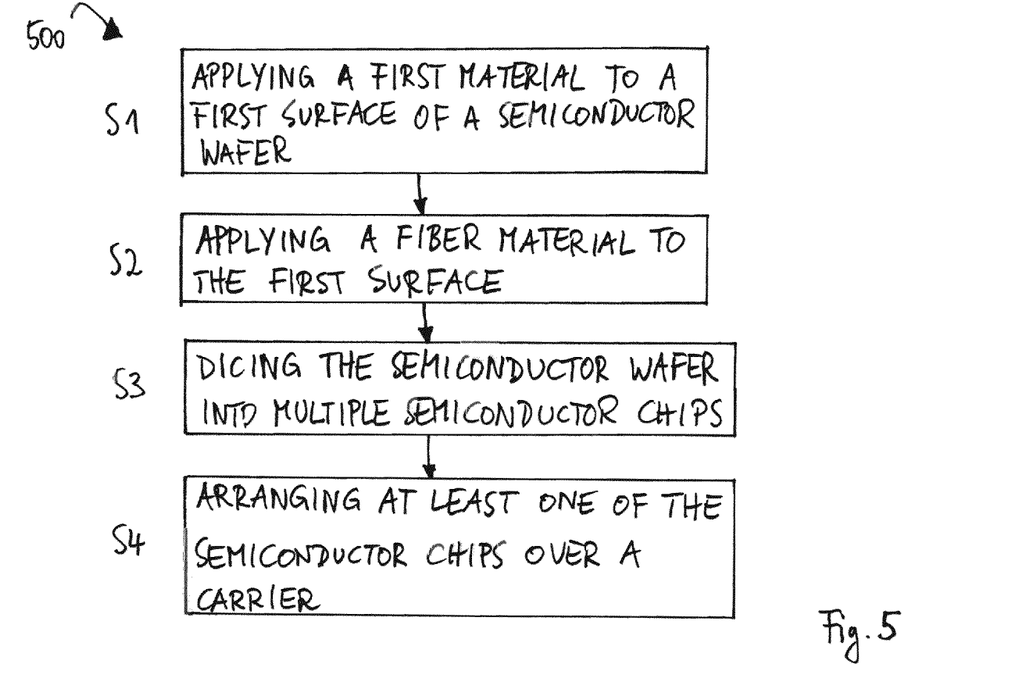
FIG. 5 schematically illustrates a method for manufacturing a device as a further exemplary embodiment.

FIG. 5 schematically illustrates a method 500 for manufacturing a device as a further exemplary embodiment. The method 500 may be applied to manufacture the device 300 and may thus be read in connection with FIG. 3. In a first method step S1, a first material is applied to a first surface of a semiconductor wafer. In a second method step S2, a fiber material is applied to the first surface of the semiconductor wafer. Here, the first material and the fiber material are applied to the first surface in such a way that the fiber material is embedded in the first material. Similar to method 400 and in a same manner, the method steps S1 and S2 are chronologically interchangeable.

In a third method step S3, the semiconductor wafer is diced into multiple semiconductor chips. For example, the dicing process may be realized by scribing and breaking, mechanical sawing or laser cutting. In a fourth method step S4, at least one of the semiconductor chips is arranged over a carrier such that the first material is arranged between the carrier and the semiconductor chip. Preferably, the first material may act as a layer providing adhesion between the carrier and the semiconductor chip.

Figure 6A:
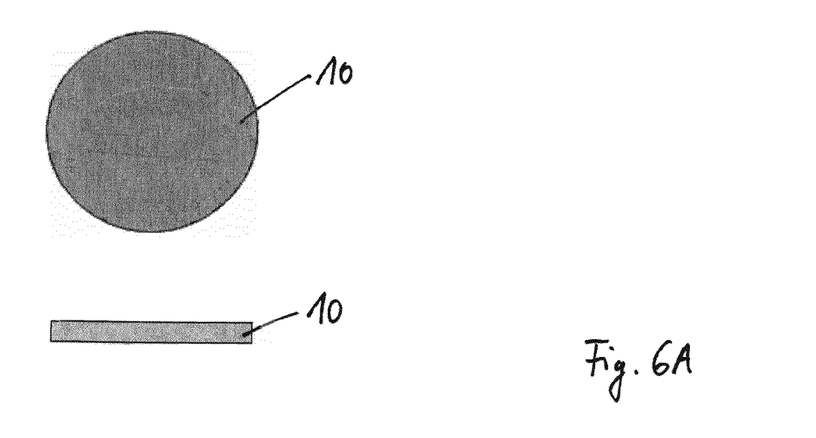
FIGS. 6A to 6F schematically illustrate an exemplary method for manufacturing a device.
Figure 6B:
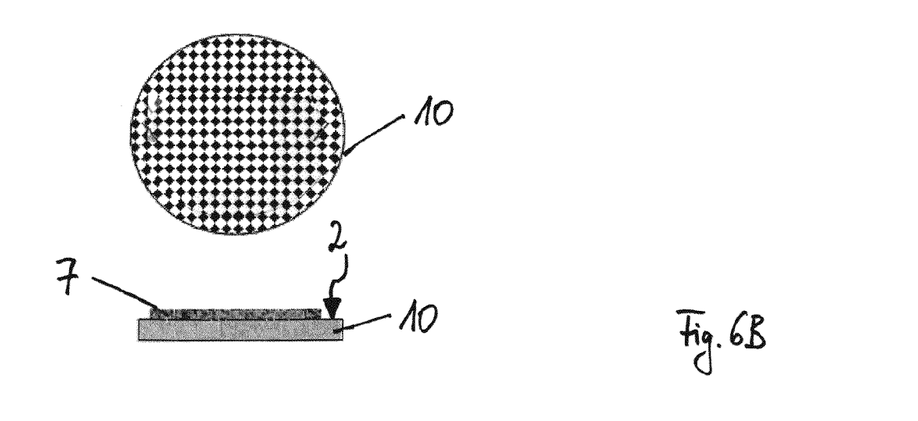
Figure 6C:
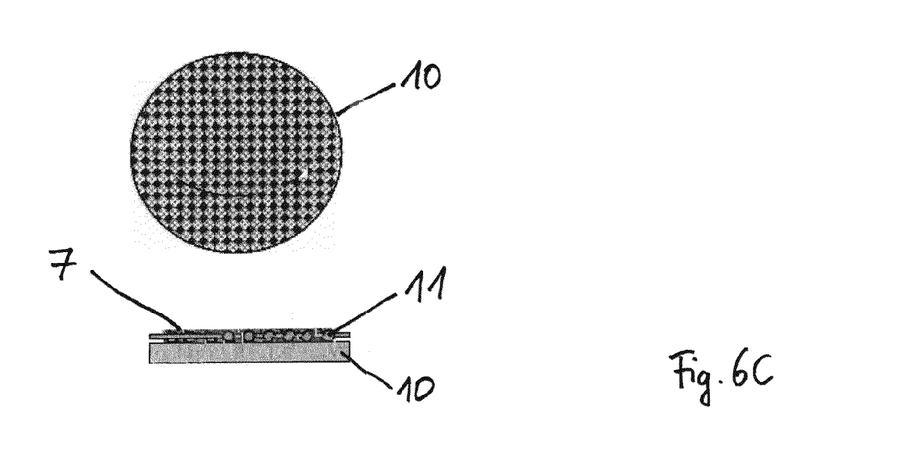
Figure 6D:
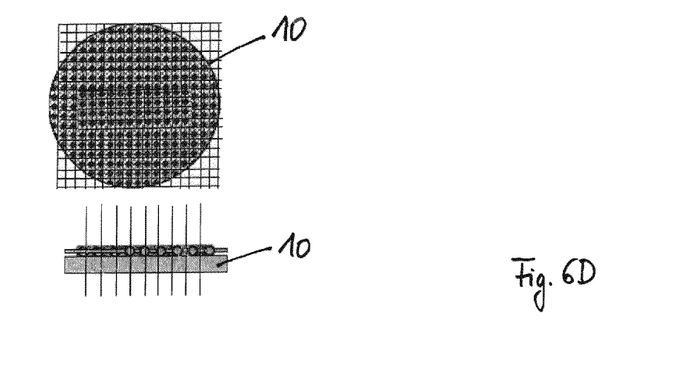
Figure 6E:
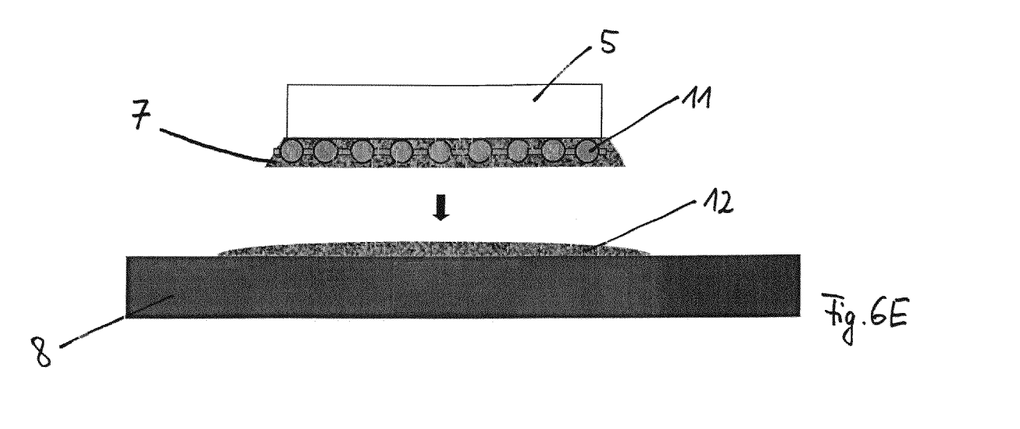
Figure 6F:
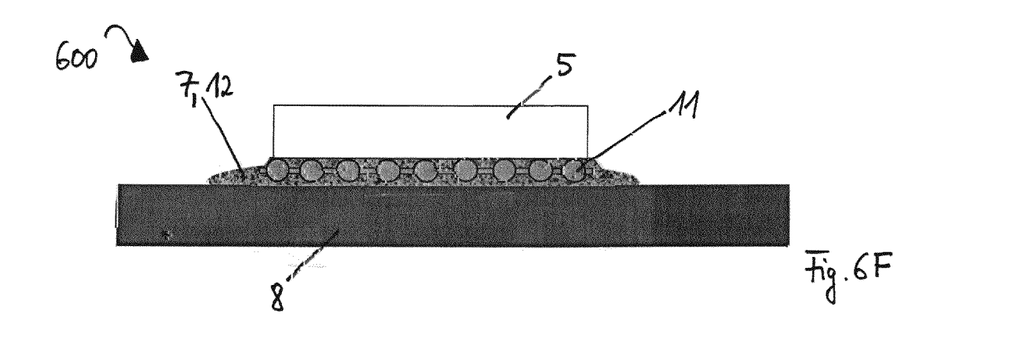

FIGS. 6A to 6F schematically illustrate an exemplary method for manufacturing a device 600 which is shown in a cross-sectional view in FIG. 6F. FIG. 6A illustrates a first method step in which a semiconductor wafer 10 is provided. Here, the upper illustration shows a top view of the semiconductor wafer 10 and the lower illustration illustrates a side view of the semiconductor wafer 10.

FIG. 6B illustrates a second method step in which a solder material 7 is applied to a first surface 2 of the semiconductor wafer 10. Again, the upper and lower illustration show a top view and side view of the semiconductor wafer 10, respectively. The solder material 7 may be applied to the first surface 2 by a printing method, for example, screen printing. Preferably, the viscosity of the solder material 7 is chosen such that the solder material 7 does not flow from the semiconductor wafer 10. A flow may, for example, be avoided by using a solder paste. Note that the solder material 7 preferably covers the whole first surface 10.

FIG. 6C illustrates a third method step in which a fiber material 11 is applied to the solder material 7. Again, the upper and lower illustration of FIG. 6C show a top view and side view of the arrangement, respectively. The fiber material 11 corresponds to a mesh as it has already been described in foregoing paragraphs. Preferably, it corresponds to a stable mesh including metal fibers. The fiber material 11 is positioned on the solder material 7 and heat is supplied to the semiconductor wafer 10 and/or the solder material 7. The solder material 7 liquefies such that the fiber material 11 may penetrate into the solder material 7. It is understood that the fiber material 11 is not necessarily completely absorbed by the solder material 7. That is, there may also remain parts of the fiber material 11 still protruding from the solder material 7.

FIG. 6D illustrates a fourth method step in which the semiconductor wafer 10 is diced into multiple bare dies. The dicing process is indicated by a mesh (see upper illustration) and vertical lines (see lower illustration). The bare dies obtained after dicing may be similar to the devices 100 and 200 shown in FIGS. 1 and 2. After the dicing process, the bare dies may be processed by subsequent process steps illustrated in FIGS. 6E and 6F. Alternatively, the bare dies may be picked and placed on a tape and delivered to a customer. The customer may further modify the bare dies or, for example, mount them on a PCB or a substrate.

FIG. 6E illustrates a fifth method step in which one of the obtained bare dies 5 is mounted on a carrier 8 such that the solder material 7 and the fiber material 11 embedded therein are arranged between the bare die 5 and the carrier 8. The carrier 8 may be a leadframe, a PCB or a substrate. A further solder material 12 is applied to the surface of the carrier 8 at the position where the bare die 5 is to be arranged.

FIG. 6F illustrates a sixth method step in which the bare die 5 and the carrier 8 are joint together by the solder materials 7 and 12. For example, the further solder material 12 on the carrier 8 may be heated and then liquefies such that the two solder materials 7 and 12 mix together when the bare die 5 is attached to the carrier 8.

Figure 7A:
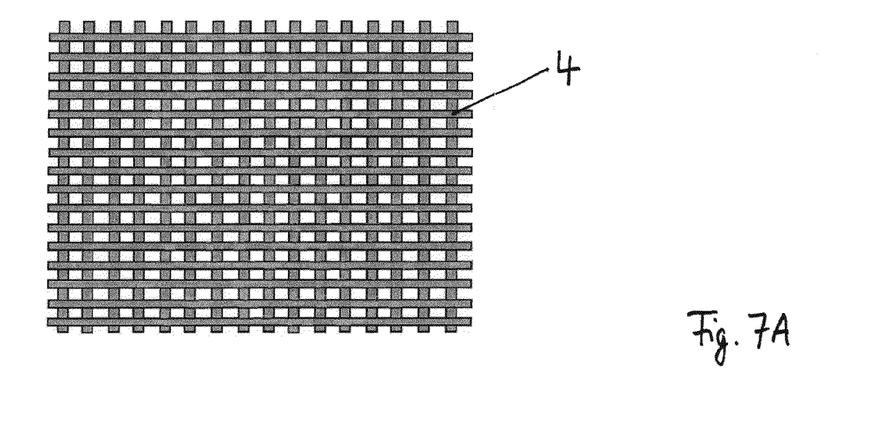
FIGS. 7A to 7E schematically illustrate an exemplary method for manufacturing a device.
Figure 7B:
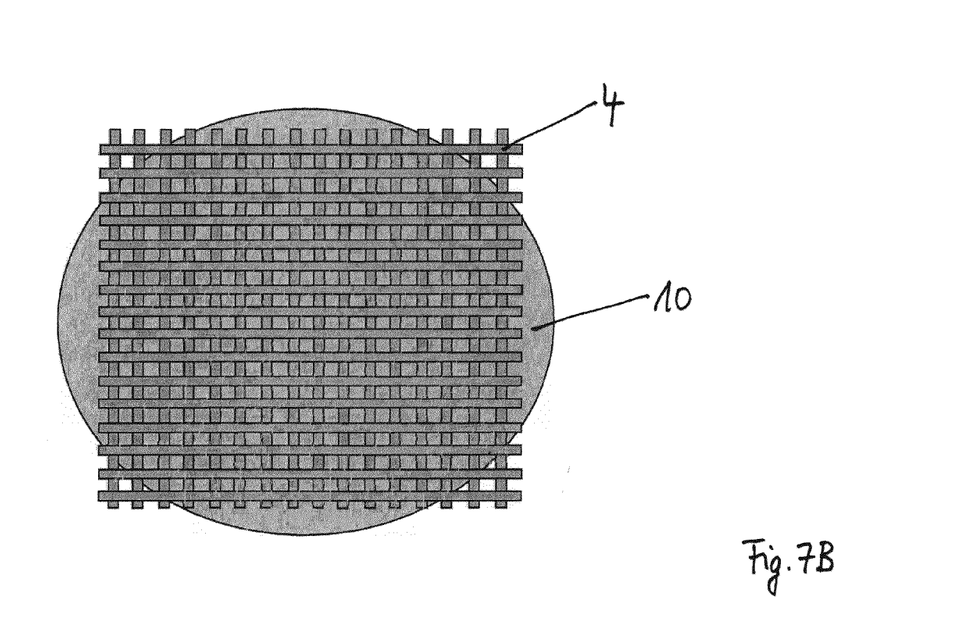
Figure 7C:
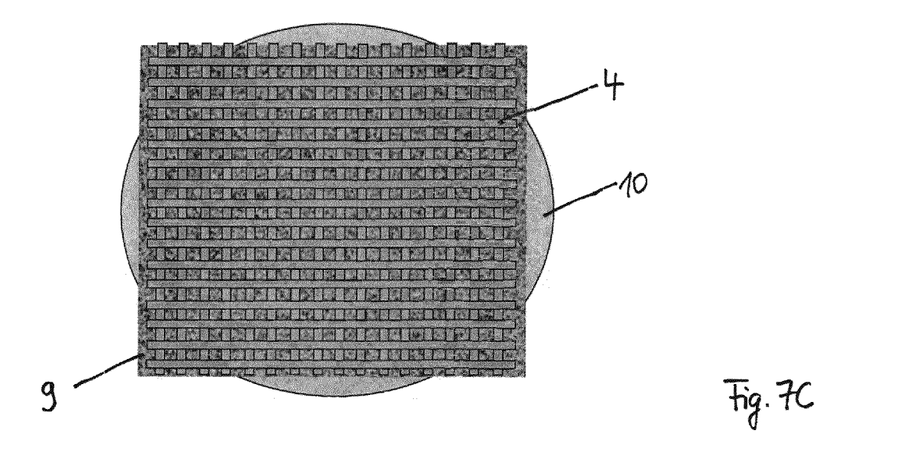
Figure 7D:
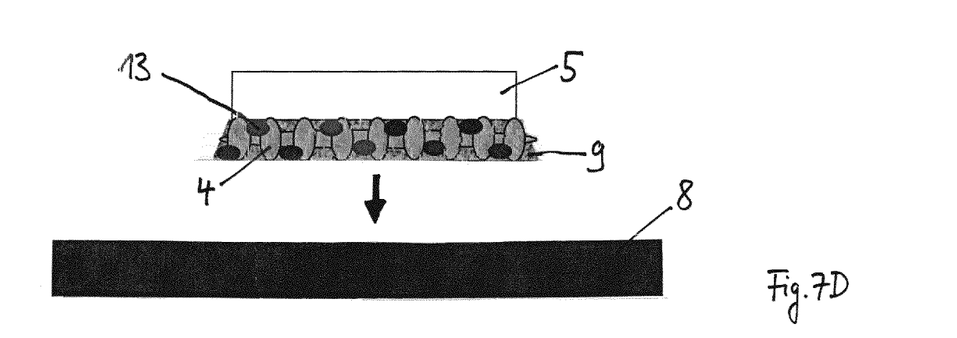
Figure 7E:
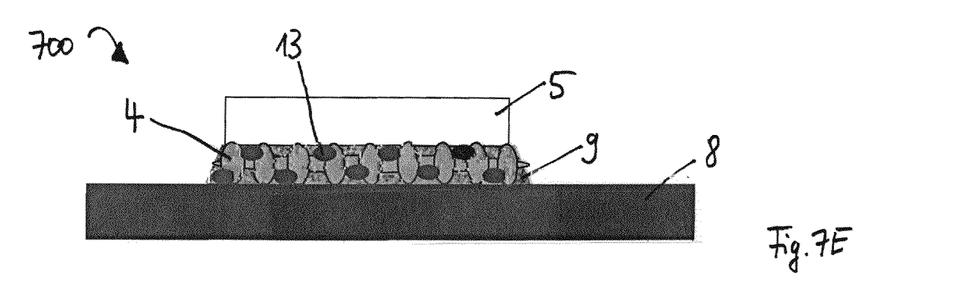

FIGS. 7A to 7E schematically illustrate an exemplary method for manufacturing a device 700 shown in a cross-sectional view in FIG. 7E. FIG. 7A illustrates a first method step in which a fiber material 4 is provided. The fiber material 4 has the form of a three-dimensional mesh and is shown in a top view perspective. Of course, FIG. 7A is of pure qualitative nature and does not necessarily correspond to a real fiber material which may include a considerably higher number of fibers which may overlap and be interwoven with each other as it has been described in previous paragraphs.

FIG. 7B illustrates a second method step in which the fiber material 4 is put on a first surface of a semiconductor wafer 10. The semiconductor wafer 10 is similar to the semiconductor wafer of FIGS. 6A to 6F.

FIG. 7C illustrates a third method step in which a precurable adhesive material 9 is applied to the semiconductor wafer 10 such that the fiber material 4 is embedded in the adhesive material 9. The fiber material 4 may be completely absorbed by the adhesive material 9 such that an integral layer is formed. Alternatively, there may also remain some parts of the fiber material 4 protruding from the adhesive material 9. As it will become apparent from FIG. 7D, the adhesive material 9 further includes conductive particles. After its application, the adhesive material 9 is precured and becomes a B-Stage material. In a subsequent method step (not shown) the semiconductor wafer 10 is diced into multiple semiconductor chips one of which is illustrated in FIG. 7D.

FIG. 7D illustrates a fourth method step in which a semiconductor chip 5 is mounted on a carrier 8. For example, the carrier 8 may be a leadframe, a PCB or a substrate. Note that FIG. 7D explicitly shows the conductive particles 13 embedded in the adhesive material 9. The conductive particles 13 are arranged between the fibers of the fiber material 4.

FIG. 7E illustrates a fifth method step in which the semiconductor chip 5 and the carrier 8 are joined together by the adhesive material 9. After the semiconductor chip 5 is attached to the carrier 8, the adhesive material 9 may be fully cured, thereby becoming a C-Stage material, such that the semiconductor chip 5 is fixed on the carrier 8. The obtained device 700 may be processed by further method steps (not shown). For example, the device 700 may be packaged or encapsulated in an encapsulation material or molding material.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein.

What is claimed is:

1. A device, comprising:
a leadframe;
a semiconductor chip arranged on the leadframe;
a conductive adhesive layer arranged between the leadframe and the semiconductor chip; and
a fiber material embedded in the conductive adhesive layer, the fiber material comprising a carbon coated metal.

2. The device of claim 1, wherein the conductive adhesive layer comprises metal particles.

3. The device of claim 2, wherein the conductive adhesive layer comprises a conductive adhesive foil.

4. A device, comprising:
a leadframe;
a conductive adhesive layer disposed on the leadframe, wherein the conductive adhesive layer comprises a three-dimensional fiber mesh, and wherein the three-dimensional fiber mesh comprises at least one of a polymer coated metal fiber and a carbon coated metal fiber;
a semiconductor chip disposed on the conductive adhesive layer, wherein the conductive adhesive layer is configured to provide an electrical contact between the leadframe and the semiconductor chip; and
an encapsulation material encapsulating the semiconductor chip.

5. The device of claim 4, wherein the metal fiber comprises steel.

6. The device of claim 4, wherein the conductive adhesive layer comprises ball-shaped metal particles.

7. The device of claim 4, wherein the three-dimensional fiber mesh protrudes out of the conductive adhesive layer.

8. The device of claim 1, wherein the fiber material protrudes out of the conductive adhesive layer.

* * * * *